(12) United States Patent
Wang et al.

(10) Patent No.: US 7,411,786 B2
(45) Date of Patent: Aug. 12, 2008

(54) HEAT DISSIPATING SYSTEM

(75) Inventors: Ning-Yu Wang, Shenzhen (CN); Li-Fu Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 74 days.

(21) Appl. No.: 11/309,118

(22) Filed: Jun. 23, 2006

(65) Prior Publication Data

US 2007/0297132 A1  Dec. 27, 2007

(51) Int. Cl.
*H05K 7/20* (2006.01)
(52) U.S. Cl. .................. 361/695; 361/697; 361/719
(58) Field of Classification Search ............. 361/687, 361/694, 695; 454/184
See application file for complete search history.

(56) References Cited

U.S. PATENT DOCUMENTS

| | | | | |
|---|---|---|---|---|
| 5,586,865 A | * | 12/1996 | Yin | 415/213.1 |
| 5,788,566 A | * | 8/1998 | McAnally et al. | 454/184 |
| 5,963,424 A | * | 10/1999 | Hileman et al. | 361/695 |
| 6,181,556 B1 | * | 1/2001 | Allman | 361/690 |
| 6,478,284 B2 | | 11/2002 | Qiu | |
| 6,549,406 B1 | * | 4/2003 | Olesiewicz et al. | 361/695 |
| 6,587,335 B1 | * | 7/2003 | Nelson et al. | 361/687 |
| 6,643,131 B1 | * | 11/2003 | Huang | 361/697 |
| 6,947,281 B2 | * | 9/2005 | Wrycraft et al. | 361/695 |
| 2004/0164652 A1 | * | 8/2004 | Chen | 312/1 |
| 2004/0196629 A1 | * | 10/2004 | Broder et al. | 361/695 |

* cited by examiner

*Primary Examiner*—Gregory D Thompson
(74) *Attorney, Agent, or Firm*—Wei Te Chung

(57) ABSTRACT

A heat dissipating system includes a chassis (10), and a fan (50). The chassis includes a rear plate (14). The rear plate has an inner surface. The fan is secured to the rear plate inside the chassis. A distance is formed between the fan and the inner surface of the rear plate.

17 Claims, 4 Drawing Sheets

HEAT DISSIPATING SYSTEM

FIELD OF THE INVENTION

The present invention relates to heat dissipating systems, and more particularly to a heat dissipating system for a computer or server.

DESCRIPTION OF RELATED ART

In a conventional computer or server, a heat dissipating device radiator is usually installed on a CPU (central processing unit) of a motherboard to remove heat generated by electronic elements, thereby avoiding damage to electronic elements from overheating. Due to rapid development of computer and server technology, an improved capability of heat dissipating thereof is accordingly needed. In some computers and servers, a fan is secured to a rear plate or a front plate of a computer or server chassis to fit the need thereof. However, because the fan described above is generally directly secured to an inner surface of the rear plate or the front plate of the computer or server chassis, increasing a distance between the fan and heat generating components, efficient heat dissipation by the fan is not achieved.

What is needed, therefore, is a more efficient heat dissipating system for a computer or server.

SUMMARY OF THE INVENTION

A heat dissipating system includes a chassis, and a fan. The chassis includes a rear plate. The rear plate has an inner surface. The fan is secured to the rear plate inside the chassis. A distance is formed between the fan and the inner surface of the rear plate.

Other advantages and novel features will be drawn from the following detailed description of preferred embodiments with attached drawings, in which:

DETAILED DESCRIPTION OF THE INVENTION

Figure 1:
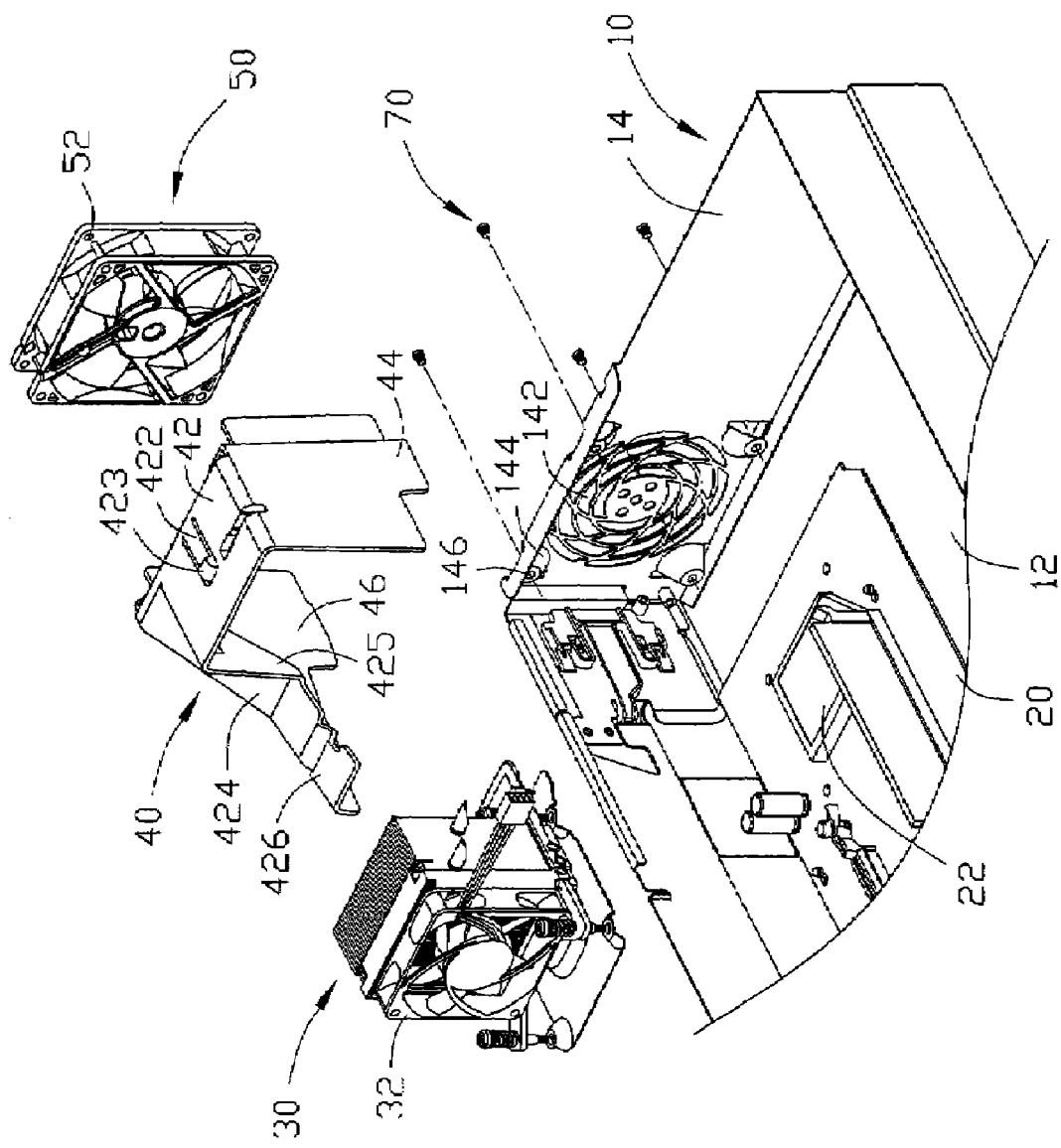
FIG. 1 is an exploded, isometric view of a heat dissipating system of a preferred embodiment of the present invention, together with a circuit board, the dissipating system including a chassis, a radiator, a bracket, and a fan.

Referring to FIG. 1, a heat dissipating system of a preferred embodiment of the present invention includes a chassis 10, a radiator 30, a bracket 40, and a fan 50.

Figure 4:
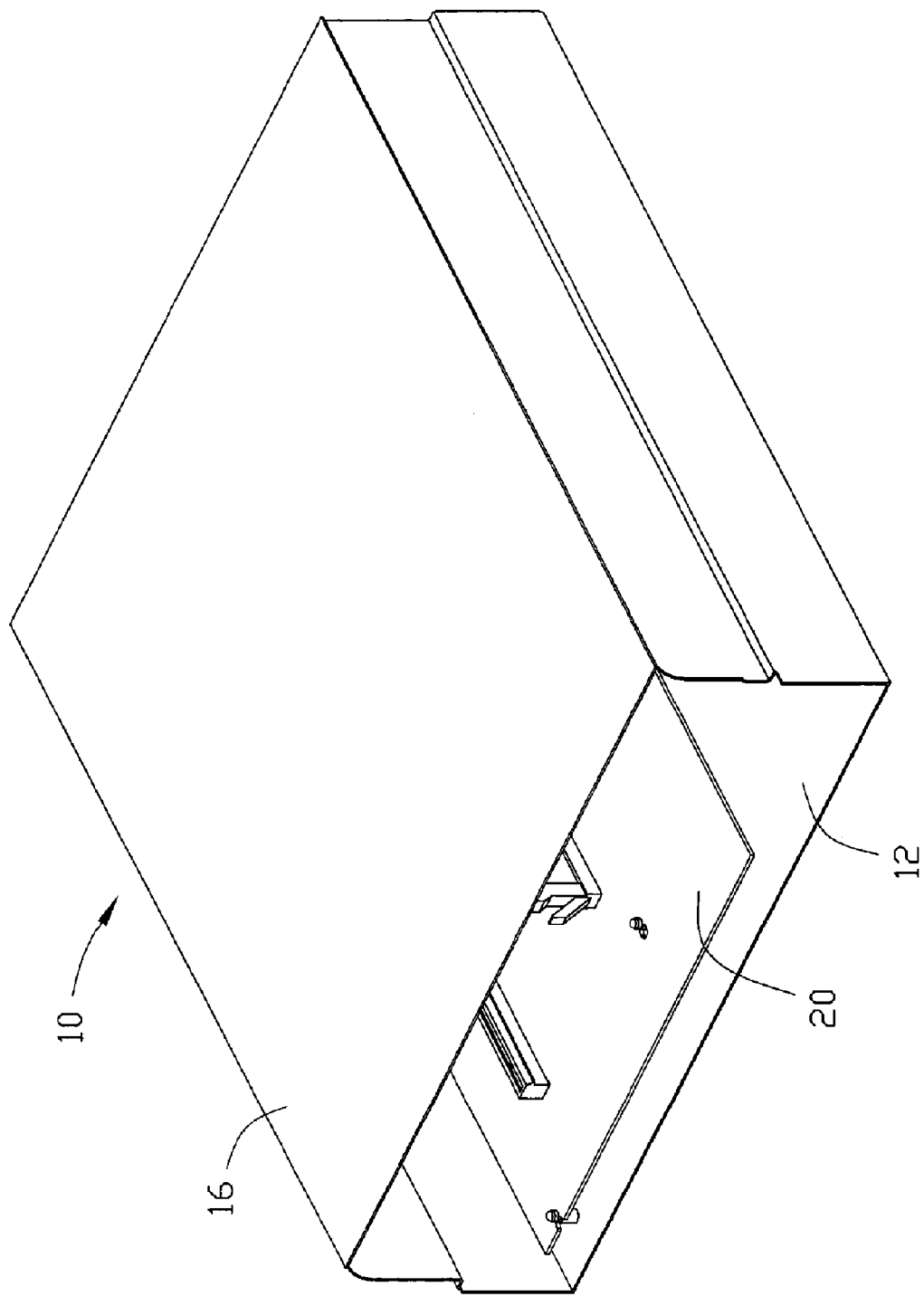
FIG. 4 is similar to FIG. 3, and showing a top plate secured on the chassis.

The chassis 10 includes a bottom plate 12, a rear plate 14, and a top plate 16 (shown in FIG. 4). The rear plate 14 is generally perpendicular to the bottom plate 12. The top plate 16 is generally parallel to the bottom plate 12 when releasably attached to the chassis 10. A plurality of through openings 142 is defined in the rear plate 14 near one end of the rear plate 14. A plurality of mounting portions 144 protrudes in from the rear plate 14 around the through openings 142. Each mounting portion 144 defines a mounting hole 146 therein.

A circuit board 20 is secured on the bottom plate 12 in the chassis 10. A processor 22 is installed on the circuit board 20, adjacent to the through openings 142 of the rear plate 14 of the chassis 10.

The radiator 30 is installed on the circuit board 20 above the processor 22, and includes a fan 32 located at a side thereof.

The bracket 40 includes a top wall 42, and two generally parallel side walls 44, 46. The side walls 44, 46 are bent down from opposite edges of, and perpendicular to, the top wall 42. The top wall 42 has a height generally equal to that of the rear plate 14 of the chassis 10. An elongated resilient portion 422 is formed on the top wall 42. The resilient portion 422 has a free end 423 higher than the top wall 42. A slanted wall 424 is formed down at a side of the top wall 42, adjacent the side wall 46. A vertical wall 425 is formed between the top wall 42 and the slanted wall 424. A distance between the vertical wall 425 and the side wall 44 is generally equal to a width of the radiator 30. A horizontal wall 426 extends out from a rear edge of the slanted wall 424.

The fan 50 has a width generally equal to a distance between the side walls 44, 46 of the bracket 40. A plurality of the securing holes 52 is defined in the fan 50, corresponding to the mounting holes 146 of the mounting portions 144 of the rear plate 14 of the chassis 10.

Figure 2:
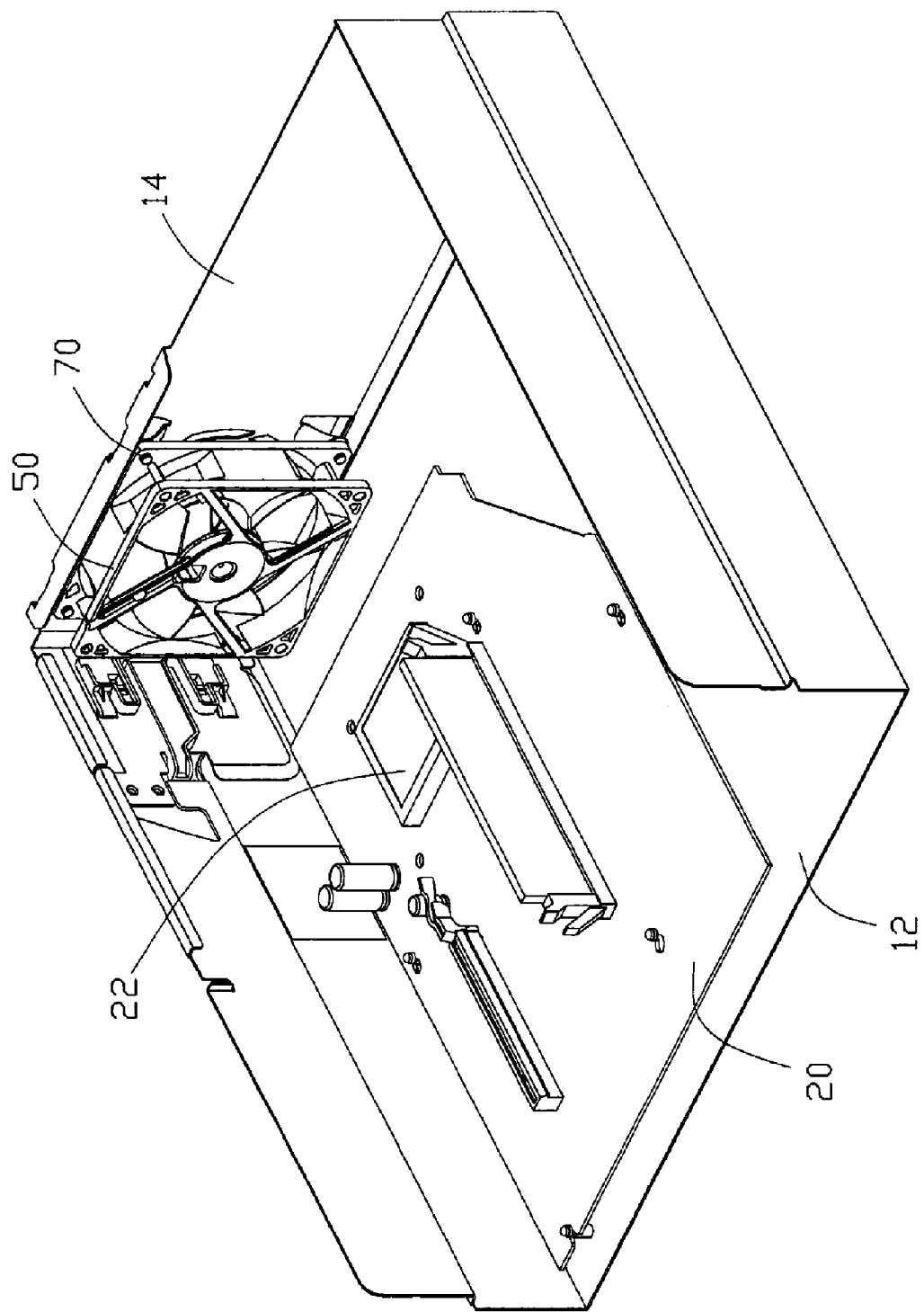
FIG. 2 is an assembled view of the chassis, the circuit board, and the fan of FIG. 1.
Figure 3:
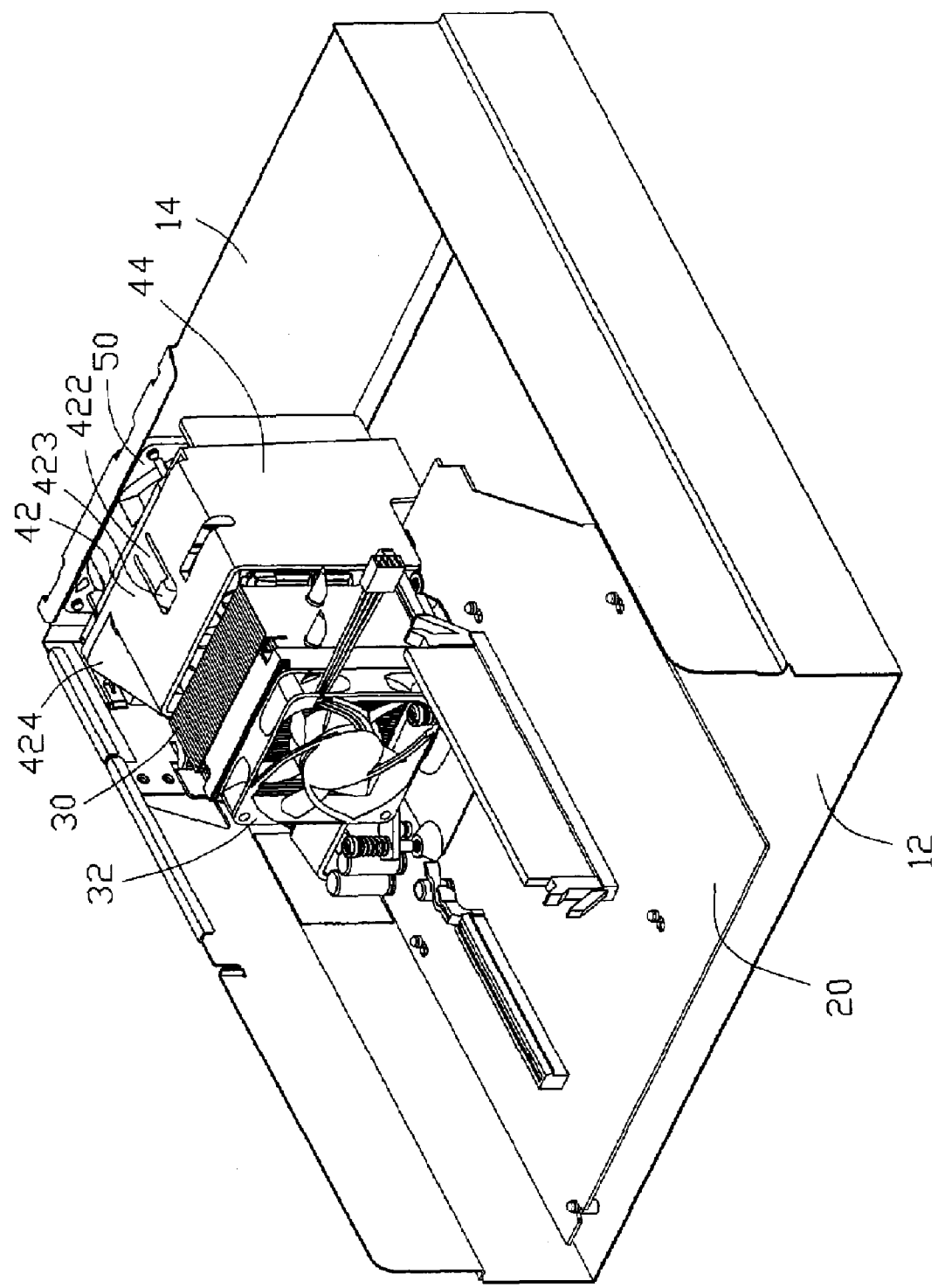
FIG. 3 is an assembled view of FIG. 1.

Referring also FIGS. 2 and 3, in assembly, the fan 50 is placed into the chassis 10, and positioned on the rear plate 14 adjacent the through openings 142. The securing holes 52 of the fan 50 align with the mounting holes 146 of the mounting portions 144 of the rear plate 14. A plurality of fasteners 70, such as screws, extends into the mounting holes 146 and the securing holes 52, thereby fixing the fan 50 on the rear plate 14. The circuit board 20 is secured to the bottom plate 12 in the chassis 10. The radiator 30 is secured to the circuit board 20 and located on the processor 22. The fan 32 of the radiator 30 is away from the rear plate 14 of the chassis 10 and aligns with the fan 50. The bracket 40 is placed between the radiator 30 and the fan 50. The top wall 42 of the bracket 40 is generally coplanar with a top side of the rear plate 14 of the chassis 10, and the free end 423 of the resilient portion 42 extends upward out of the chassis 10. The horizontal wall 426 is located above the circuit board 20, thereby avoiding pressing and damage to electronic elements of the circuit board 20. Front edges of the top wall 42, the vertical wall 425, and the side wall 44 are adjacent the radiator 30. The side walls 44, 46 sandwich the fan 50, and bottom edges and rear edges of the side walls 44, 46 respectively abut on the bottom plate 12 and the rear plate 14. An air channel is thereby formed between the radiator 30 and the fan 50, for guiding airflow from the radiator 30 to the fan 50. Referring also to FIG. 4, the top plate 16 is releasably secured to the chassis 10 on the rear plate 14. Due to the free end 423 of the resilient portion 422 of the bracket 40 extending out of the chassis 10, the top plate 16 presses the free end 423 to deform the resilient portion 422, thereby securing the bracket 40 between the bottom plate 12 and the top plate 16 of the chassis 10.

In use, heat generated by the processor 22 is removed from the processor 22 by the radiator 30. The fan 32 of the radiator 30 blows the heat towards the fan 50 through the air channel. The heat is quickly blown out of the chassis 10 by the fan 50.

In this preferred embodiment, because the mounting portions 144 protrude in from the rear plate 14, a distance is formed between the fan 50 and an inner surface of the rear plate 14 when the fan 50 secured to mounting portions 144. The fan 50 secured on the mounting portions 144 is closer to the radiator 30 than if directly secured on the inner surface of the rear plate 14. The airflow through the radiator 30 is accelerated, thereby improving dissipation of heat generated in the computer or server.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating system comprising:
a chassis comprising a rear plate and a bottom plate perpendicular to the rear plate;
a fan secured to the rear plate inside the chassis;
a bracket positioned on the bottom plate of the chassis at one side of the fan to form an air channel for guiding airflow flowing to the fan, a resilient portion being formed on the bracket; and
a top plate being parallel to the bottom plate and pressing the resilient portion to position the bracket between the top plate and the bottom plate after the top plate is releasably attached to the chassis.

2. The heat dissipating system as described in claim 1, wherein a mounting portion protrudes in from the inner surface of the rear plate of the chassis, the fan being secured to the mounting portion thereby forming a gap between the fan and the rear plate.

3. The heat dissipating system as described in claim 2, wherein the rear plate defines a plurality of through openings therein, the mounting portion being formed adjacent the through openings.

4. The heat dissipating system as described in claim 1, further comprising a radiator secured in the chassis, the bracket being positioned between the radiator and the fan.

5. The heat dissipating system as described in claim 1, wherein the bracket comprises two parallel side walls, the side walls sandwiching the fan when the bracket is attached to the chassis.

6. The heat dissipating system as described in claim 5, wherein the bracket further comprises a top wall perpendicular to the side walls, the resilient portion being formed on the top wall of the bracket.

7. The heat dissipating system as described in claim 6, wherein a slanted wall is formed from the top wall of the bracket adjacent one of the side walls, a vertical wall parallel to the side walls being formed between the top wall and the slanted wall, a distance between the vertical wall and the other side wall being generally equal to a width of the radiator.

8. The heat dissipating system as described in claim 6, wherein the top wall of the bracket is generally coplanar with a top side of the rear plate, the resilient portion having a free end extending out of the chassis when the bracket is attached to the chassis.

9. A heat dissipating system comprising:
a chassis comprising a rear plate, the rear plate having an inner surface, a mounting portion being bent from the inner surface;
a circuit board installed into the chassis;
a radiator attached to the circuit board; and
a fan secured on the mounting portion of the rear plate to thereby be located on a plane parallel to the rear plate, the plane being positioned between the circuit board and the inner surface of the rear plate, and generally parallel to the inner surface of the rear plate, a distance between the plane and the radiator being smaller than between the inner surface and the radiator.

10. The heat dissipating system as described in claim 9, wherein the rear plate defines a plurality of through openings therein, the mounting portion being formed adjacent the through openings, the fan facing the through openings with the mounting portion located therebetween.

11. The heat dissipating system as described in claim 9, further comprising a bracket which forms an air channel between the radiator and the fan.

12. The heat dissipating system as described in claim 11, wherein the bracket comprises two parallel side walls, the side walls sandwiching the fan when the bracket is attached to the chassis.

13. The heat dissipating system as described in claim 12, wherein the bracket further comprises a top wall perpendicular to the side walls, the top wall having a resilient portion, and the chassis further comprises a bottom plate and a top plate parallel to the bottom plate, the top plate pressing the resilient portion to position the bracket between the top plate and the bottom plate when releasably attached to the rear plate.

14. The heat dissipating system as described in claim 13, wherein a slanted wall is formed on the top wall of the bracket adjacent one of the side walls, a vertical wall parallel to the side walls being formed between the top wall and the slanted wall, a distance between the vertical wall and the other side wall being generally equal to a width of the radiator.

15. The heat dissipating system as described in claim 13, wherein the top wall of the bracket is generally coplanar with the rear plate, the resilient portion having a free end extending out of the chassis when the bracket is attached to the chassis.

16. A heat dissipating system comprising:
a chassis having a plurality of plates and an electronic component;
a radiator mounted an the electronic component;
a fan secured to one of the plates with a gap formed between the fan and an inner surface of said one of the plates, the fan communicating with outside of the chassis; and
a bracket being positioned between the radiator with the fan for guiding an airflow flowing from the radiator to the fan;
wherein a plurality of mounting portions protrudes inward from the inner surface of said one of the plates, the fan being secured on the mounting portions which separates the fan from the inner surface of said one of the plates with the gap.

17. The heat dissipating system as described in claim 16, further comprising an additional fan attached on one side of the radiator and aligning with the fan for accelerating the airflow.

* * * * *